(12) United States Patent
Nakashima

(10) Patent No.: US 11,451,142 B2
(45) Date of Patent: Sep. 20, 2022

(54) VOLTAGE CONVERSION DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Arata Nakashima, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 119 days.

(21) Appl. No.: 17/058,278

(22) PCT Filed: May 14, 2019

(86) PCT No.: PCT/JP2019/019065
§ 371 (c)(1),
(2) Date: Nov. 24, 2020

(87) PCT Pub. No.: WO2019/225392
PCT Pub. Date: Nov. 28, 2019

(65) Prior Publication Data
US 2021/0218333 A1      Jul. 15, 2021

(30) Foreign Application Priority Data

May 24, 2018  (JP) .............................. JP2018-099522

(51) Int. Cl.
*H02M 3/156* (2006.01)
*H02M 7/5395* (2006.01)
*H03K 19/20* (2006.01)

(52) U.S. Cl.
CPC ......... *H02M 3/156* (2013.01); *H02M 7/5395* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 6,421,263 B1 * | 7/2002 | Shinkawa | H02M 3/158 368/204 |
| 8,022,743 B2 * | 9/2011 | Miyazaki | B41J 2/04596 327/172 |

(Continued)

FOREIGN PATENT DOCUMENTS

| | | |
|---|---|---|
| JP | 2002-112534 A | 4/2002 |
| JP | 2012-125046 A | 6/2012 |

(Continued)

OTHER PUBLICATIONS

International Search Report, Application No. PCT/JP2019/019065, dated Jul. 23, 2019. ISA/Japan Patent Office.

*Primary Examiner* — Jeffrey A Gblende
(74) *Attorney, Agent, or Firm* — Honigman LLP

(57) ABSTRACT

An object is to reduce the time it takes to switch PWM signals used to perform drive control of a voltage converter. An inverted PWM signal used to perform drive control of a voltage conversion unit (20) is generated based on a result of comparison between a first voltage value and a first target value, and a second PWM signal used to perform drive control of the voltage conversion unit (20) is generated based on a result of comparison between a second voltage value and a second target value. Then, an AND signal or an OR signal is generated, the AND signal being in an ON state when both of the inverted PWM signal and the second PWM (Continued)

signal are in an ON state, the OR signal being in an ON state when at least one of the inverted PWM signal and the second PWM is in an ON state.

4 Claims, 11 Drawing Sheets

(56) References Cited

U.S. PATENT DOCUMENTS

| | | | | |
|---|---|---|---|---|
| 8,384,367 | B2* | 2/2013 | Murakami | H02M 3/156 323/225 |
| 8,669,749 | B2* | 3/2014 | Shiwaya | H02M 3/1584 323/272 |
| 9,606,965 | B2* | 3/2017 | Yoshimura | G11C 19/0883 |
| 2010/0164446 | A1 | 7/2010 | Matsuo et al. | |

FOREIGN PATENT DOCUMENTS

| | | |
|---|---|---|
| JP | 2014-131444 A | 7/2014 |
| JP | 2015-77933 | 4/2015 |

* cited by examiner (A)

(B)

(A)

(B)

VOLTAGE CONVERSION DEVICE

CROSS-REFERENCE TO RELATED APPLICATIONS

This application is the U.S. national stage of PCT/JP2019/019065 filed on May 14, 2019, which claims priority of Japanese Patent Application No. JP 2018-099522 filed on May 24, 2018, the contents of which are incorporated herein.

TECHNICAL FIELD

The present disclosure relates to a voltage conversion device.

BACKGROUND

Conventionally, voltage conversion devices are known that can step down voltage that is input from a high-voltage side and output the stepped-down voltage to a low-voltage side, and step up voltage that is input from the low-voltage side and output the stepped-up voltage to the high-voltage side. For example, a step-up/down converter described in JP 2015-77933A includes a voltage conversion unit and a microcomputer that performs drive control of the voltage conversion unit. The microcomputer can detect voltage values of a 12 V side (low-voltage side) and a 48 V side (high-voltage side) and perform step-down driving and step-up driving of the voltage conversion unit based on the detected voltage values.

In this step-up/down converter, a step-down PWM signal is output to execute the step-down driving of the voltage conversion unit, and a step-up PWM signal is output to execute the step-up driving of the voltage conversion unit. Accordingly, in a situation in which one of the step-down driving and the step-up driving is being executed, switching to the other type of driving involves processing for determining to switch the manner of driving and processing for stopping output of a PWM signal that is being output and then starting to output the other PWM signal. Therefore, there is a problem in that it takes a certain time to switch the PWM signals.

The present disclosure was made to solve at least one of the aforementioned problems, and a problem to be solved by the present disclosure is to provide a technology that can reduce the time it takes to switch PWM signals used to perform drive control of a voltage converter.

SUMMARY

A voltage conversion device according to a first aspect of the present disclosure includes a voltage conversion unit that includes a first switching element on a high side and a second switching element on a low side and is configured to perform a step-down operation of stepping down an input voltage applied to a first conduction path and outputting the stepped-down voltage to a second conduction path through an ON/OFF operation of the first switching element and a step-up operation of stepping up an input voltage applied to the second conduction path and outputting the stepped-up voltage to the first conduction path through an ON/OFF operation of the second switching element. A first voltage detection unit is configured to detect a first voltage value that is a voltage value of the first conduction path. A second voltage detection unit is configured to detect a second voltage value that is a voltage value of the second conduction path. A first signal generation unit is configured to generate an inverted PWM signal and a second PWM signal in parallel, the inverted PWM signal being a PWM signal obtained by inverting a first PWM signal that is a signal for updating a duty ratio to make the voltage value of the first conduction path approach a first target value based on the first voltage value and the first target value, the second PWM signal being synchronized with the first PWM signal and being a signal for updating a duty ratio to make the voltage value of the second conduction path approach a second target value based on the second voltage value and the second target value. A second signal generation unit to which the inverted PWM signal and the second PWM signal generated by the first signal generation unit are input and is configured to generate at least either of an AND signal and an OR signal as a control signal, the AND signal being an ON signal when both of the inverted PWM signal and the second PWM signal are ON signals and being an OFF signal when at least one of the inverted PWM signal and the second PWM signal is an OFF signal, the OR signal being an ON signal when at least one of the inverted PWM signal and the second PWM signal is an ON signal and being an OFF signal when both of the inverted PWM signal and the second PWM signal are OFF signals. A drive unit is configured to input the control signal generated by the second signal generation unit to the first switching element and input an inverted signal that is obtained by inverting the control signal to the second switching element.

A voltage conversion device according to a second aspect of the present disclosure includes a voltage conversion unit that includes a first switching element on a high side and a second switching element on a low side and is configured to perform a step-down operation of stepping down an input voltage applied to a first conduction path and outputting the stepped-down voltage to a second conduction path through an ON/OFF operation of the first switching element and a step-up operation of stepping up an input voltage applied to the second conduction path and outputting the stepped-up voltage to the first conduction path through an ON/OFF operation of the second switching element. A first voltage detection unit is configured to detect a first voltage value that is a voltage value of the first conduction path. A second voltage detection unit is configured to detect a second voltage value that is a voltage value of the second conduction path. A first signal generation unit is configured to generate an inverted PWM signal and a first PWM signal in parallel, the first PWM signal being a signal for updating a duty ratio to make the voltage value of the first conduction path approach a first target value based on the first voltage value and the first target value, the inverted PWM signal being a PWM signal obtained by inverting a second PWM signal that is synchronized with the first PWM signal and is a signal for updating a duty ratio to make the voltage value of the second conduction path approach a second target value based on the second voltage value and the second target value. A second signal generation unit to which the inverted PWM signal and the first PWM signal generated by the first signal generation unit are input and that is configured to generate at least either of an AND signal and an OR signal as a control signal, the AND signal being an ON signal when both of the inverted PWM signal and the first PWM signal are ON signals and being an OFF signal when at least one of the inverted PWM signal and the first PWM signal is an OFF signal, the OR signal being an ON signal when at least one of the inverted PWM signal and the first PWM signal is an ON signal and being an OFF signal when both of the inverted PWM signal and the first PWM signal are OFF signals. A drive unit is configured to input the control signal generated by the second signal generation unit to the second switching element and input an inverted signal that is obtained by inverting the control signal to the first switching element.

A voltage conversion device according to a third aspect of the present disclosure includes a voltage conversion unit that includes a first switching element on a high side and a second switching element on a low side and is configured to perform a step-down operation of stepping down an input voltage applied to a first conduction path and outputting the stepped-down voltage to a second conduction path through an ON/OFF operation of the first switching element and a step-up operation of stepping up an input voltage applied to the second conduction path and outputting the stepped-up voltage to the first conduction path through an ON/OFF operation of the second switching element. A first voltage detection unit is configured to detect a first voltage value that is a voltage value of the first conduction path. A second voltage detection unit is configured to detect a second voltage value that is a voltage value of the second conduction path. A mediation unit is configured to select a larger value or a smaller value out of an inverted duty ratio and a second duty ratio, the inverted duty ratio being a value obtained by subtracting a first duty ratio from 100%, the first duty ratio being a duty ratio for making the voltage value of the first conduction path approach a first target value based on the first voltage value and the first target value, the second duty ratio being a duty ratio for making the voltage value of the second conduction path approach a second target value based on the second voltage value and the second target value. A drive unit is configured to input a PWM signal according to a duty ratio selected by the mediation unit as a control signal to the first switching element and input an inverted signal that is obtained by inverting the control signal to the second switching element.

A voltage conversion device according to a fourth aspect of the present disclosure includes a voltage conversion unit that includes a first switching element on a high side and a second switching element on a low side and is configured to perform a step-down operation of stepping down an input voltage applied to a first conduction path and outputting the stepped-down voltage to a second conduction path through an ON/OFF operation of the first switching element and a step-up operation of stepping up an input voltage applied to the second conduction path and outputting the stepped-up voltage to the first conduction path through an ON/OFF operation of the second switching element. A first voltage detection unit is configured to detect a first voltage value that is a voltage value of the first conduction path. A second voltage detection unit is configured to detect a second voltage value that is a voltage value of the second conduction path. A mediation unit is configured to select a larger value or a smaller value out of an inverted duty ratio and a first duty ratio, the inverted duty ratio being a value obtained by subtracting a second duty ratio from 100%, the first duty ratio being a duty ratio for making the voltage value of the first conduction path approach a first target value based on the first voltage value and the first target value, the second duty ratio being a duty ratio for making the voltage value of the second conduction path approach a second target value based on the second voltage value and the second target value. A drive unit is configured to input a PWM signal according to a duty ratio selected by the mediation unit as a control signal to the second switching element and input an inverted signal that is obtained by inverting the control signal to the first switching element.

Advantageous Effects of Disclosure

With the voltage conversion device according to the present disclosure, it is possible to perform an operation of continuously calculating and updating both a duty ratio for the step-down operation and a duty ratio for the step-up operation, and furthermore, when either one of the step-down operation and the step-up operation is being executed, if the balance between the duty ratios has changed to a state in which the other type of operation needs to be prioritized, it is possible to immediately change signals applied to the first switching element and the second switching element to prioritize the other type of operation.

DETAILED DESCRIPTION OF PREFERRED EMBODIMENTS

In the first or the second aspect, the second signal generation unit may also include an AND circuit that generates the AND signal, an OR circuit that generates the OR signal, and a selection unit that selects either of a signal output from the AND circuit and a signal output from the OR circuit as the control signal.

With this configuration, it is possible to select which of control for the step-up operation and control for the step-down operation is to be prioritized when the two types of control compete with each other.

In the third or the fourth aspect, the mediation unit may also include a switching unit that switches which of the larger value or the smaller value is to be extracted.

With this configuration, it is possible to select which of control for the step-up operation and control for the step-down operation is to be prioritized when the two types of control compete with each other.

Embodiment 1

The following describes Embodiment 1, which is a specific embodiment of the present disclosure.

Figure 1:
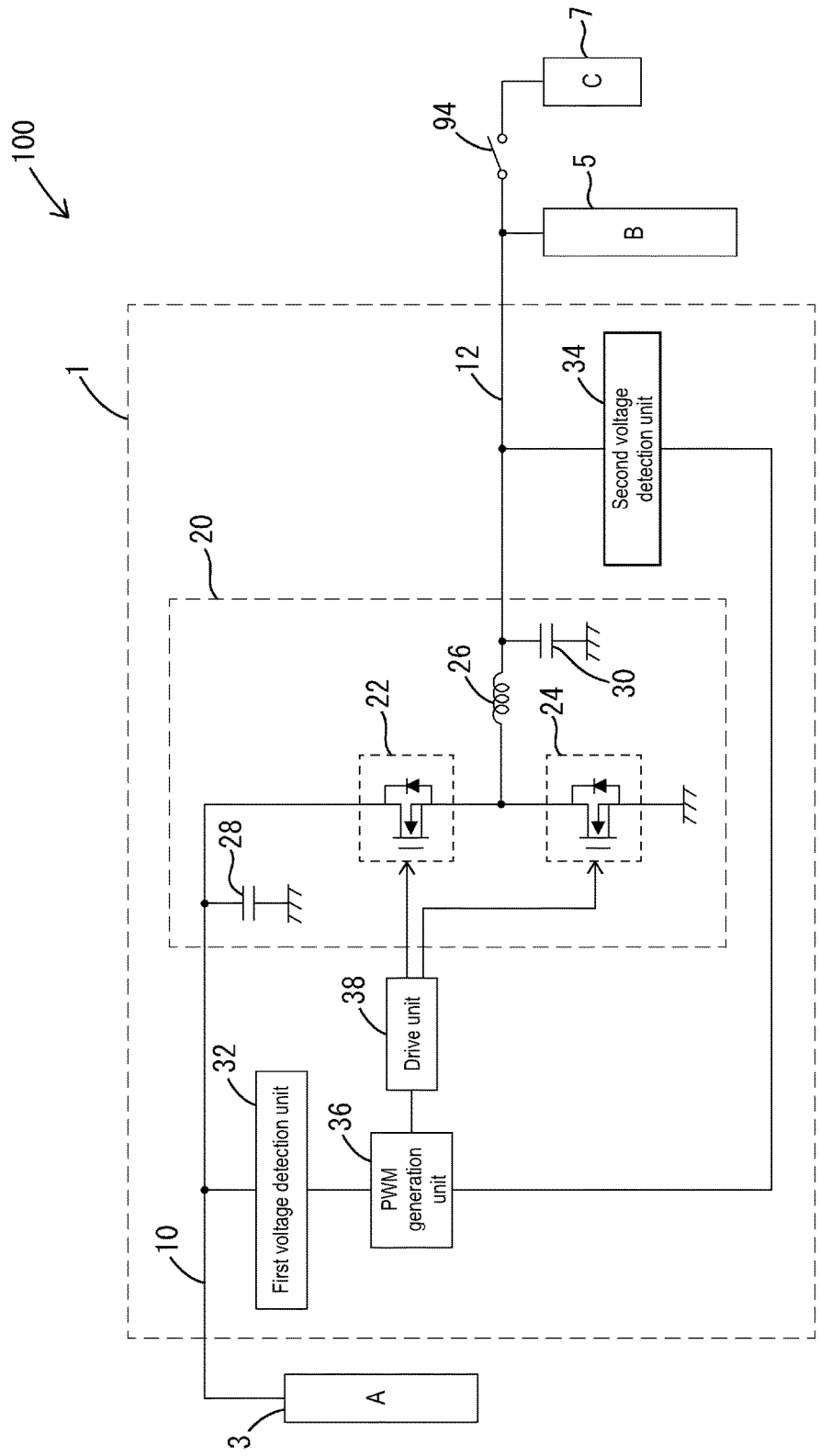
FIG. 1 is a block diagram showing an example of a configuration of a power supply system according to Embodiment 1.

A power supply system 100 shown in FIG. 1 is installed in a vehicle or the like, includes a first power supply unit 3, a second power supply unit 5, a load 7, and a voltage conversion device 1, and is configured as a system that can supply power to the load 7 by using the first power supply unit 3 or the second power supply unit 5 as a power supply source.

The first power supply unit 3 is configured as a vehicle-mounted battery such as a lithium ion battery. A high-potential side terminal of the first power supply unit 3 is electrically connected to a first conduction path 10, and the first power supply unit 3 applies a predetermined output voltage (e.g., 48 V) to the first conduction path 10.

The second power supply unit 5 is configured as a vehicle-mounted battery such as a lead storage battery. A high-potential side terminal of the second power supply unit 5 is electrically connected to a second conduction path 12, and the second power supply unit 5 applies a predetermined output voltage (e.g., 12 V) to the second conduction path 12. The output voltage applied to the second conduction path 12 by the second power supply unit 5 is set to be lower than the output voltage applied to the first conduction path 10 by the first power supply unit 3.

The load 7 is a starter, for example, and includes a motor as a driving source, and can perform an operation to increase the number of revolutions up to a state in which an engine of the vehicle appropriately starts. The load 7 is electrically connected to the second conduction path 12 and can operate using power supplied from the second power supply unit 5. Also, the load 7 is electrically connected to the first conduction path 10 via the voltage conversion device 1 and can also operate using power supplied from the first power supply unit 3.

The voltage conversion device 1 includes a voltage conversion unit 20 that is provided between the first conduction path 10 and the second conduction path 12. The voltage conversion unit 20 is a voltage converter, for example, and can perform a step-down operation of stepping down voltage that is input from the first conduction path 10 and outputting the stepped-down voltage to the second conduction path 12, and a step-up operation of stepping up voltage that is input from the second conduction path 12 and outputting the stepped-up voltage to the first conduction path 10.

The voltage conversion unit 20 includes a first switching element 22 (hereinafter also referred to as a "switching element 22") on a high side, a second switching element 24 (hereinafter also referred to as a "switching element 24") on a low side, and an inductor 26. The switching elements 22 and 24 are configured as N-channel MOSFETs. The first conduction path 10 is electrically connected to the drain of the switching element 22. The drain of the switching element 24 and one end of the inductor 26 are connected to the source of the switching element 22. The drain of the switching element 24 is connected to a connection point between the switching element 22 and the inductor 26. The source of the switching element 24 is earthed.

The voltage conversion unit 20 includes a high side capacitor 28 and a low side capacitor 30. One end of the capacitor 28 is connected to the first conduction path 10 and the other end of the capacitor 28 is earthed. One end of the capacitor 30 is connected to the second conduction path 12 and the other end of the capacitor 30 is earthed.

The voltage conversion device 1 includes a first voltage detection unit 32, a second voltage detection unit 34, a PWM generation unit 36, and a drive unit 38. The first voltage detection unit 32 and the second voltage detection unit 34 are each configured as a voltage detection circuit. The first voltage detection unit 32 detects a voltage value (hereinafter also referred to as a "first voltage value") of the first conduction path 10 and outputs an analog voltage indicating the detected first voltage value to the PWM generation unit 36. The second voltage detection unit 34 detects a voltage value (hereinafter also referred to as a "second voltage value") of the second conduction path 12 and outputs an analog voltage indicating the detected second voltage value to the PWM generation unit 36.

The PWM generation unit 36 generates a PWM signal using the analog voltage indicating the first voltage value and the analog voltage indicating the second voltage value and outputs the PWM signal to the drive unit 38. The drive unit 38 to which the PWM signal is input generates PWM signals that are complementary to each other and applies the PWM signals to the gates of the switching elements 22 and 24 (the voltage conversion unit 20) to drive the voltage conversion unit 20. Specifically, the drive unit 38 inputs a control signal that is generated by a second signal generation unit 72 to the switching element 22 and inputs an inverted signal that is obtained by inverting the control signal to the switching element 24.

The voltage conversion unit 20 performs the step-up operation or the step-down operation such that the ratio between the first voltage value and the second voltage value matches the ratio between a duty ratio of a PWM signal applied to the switching element 24 and a duty ratio of a PWM signal applied to the switching element 22. Accordingly, the voltage conversion device 1 of Embodiment 1 can adjust the ratio between the first voltage value and the second voltage value by adjusting the duty ratios of the PWM signals applied to the voltage conversion unit 20. In the voltage conversion device 1, adjustment is performed such that the ratio (%) of the first voltage value relative to the sum of the first voltage value and the second voltage value becomes a first target ratio (%) and the ratio (%) of the second voltage value relative to the sum of the first voltage value and the second voltage value becomes a second target ratio (100%−first target ratio (%)). This adjustment is realized with the following configuration.

Figure 2:
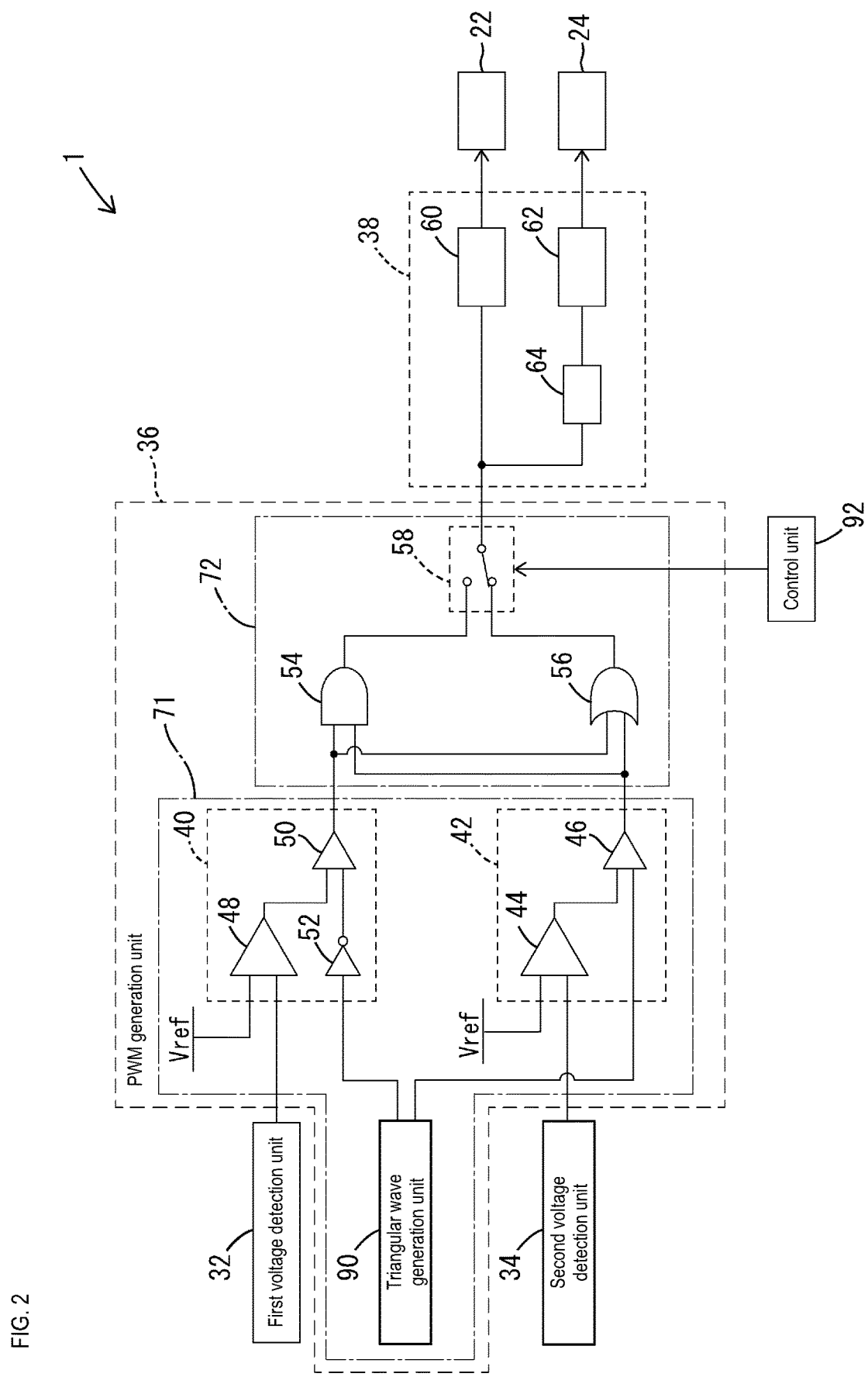
FIG. 2 is a block diagram showing a specific example of a configuration of a voltage conversion device.

As shown in FIG. 2, the PWM generation unit 36 mainly includes a first signal generation unit 71 and the second signal generation unit 72. The first signal generation unit 71 includes a second PWM generation circuit 42, a first PWM generation circuit 40, and a triangular wave generation unit 90. The second signal generation unit 72 includes an AND circuit 54, an OR circuit 56, a selection unit 58, and so on.

The second PWM generation circuit 42 generates a second PWM signal that is a signal for updating a duty ratio to make the voltage value of the second conduction path 12 approach a second target value based on the second voltage value and the second target value. The second PWM generation circuit 42 includes a second comparison circuit 44 that compares an analog voltage indicating the second voltage value with the second target value to find a magnitude relation therebetween and a second signal generation circuit 46 that generates the second PWM signal based on a result of comparison performed by the second comparison circuit 44 and a triangular wave. The triangular wave is generated by the triangular wave generation unit 90 provided in the power supply system 100.

Figure 3:
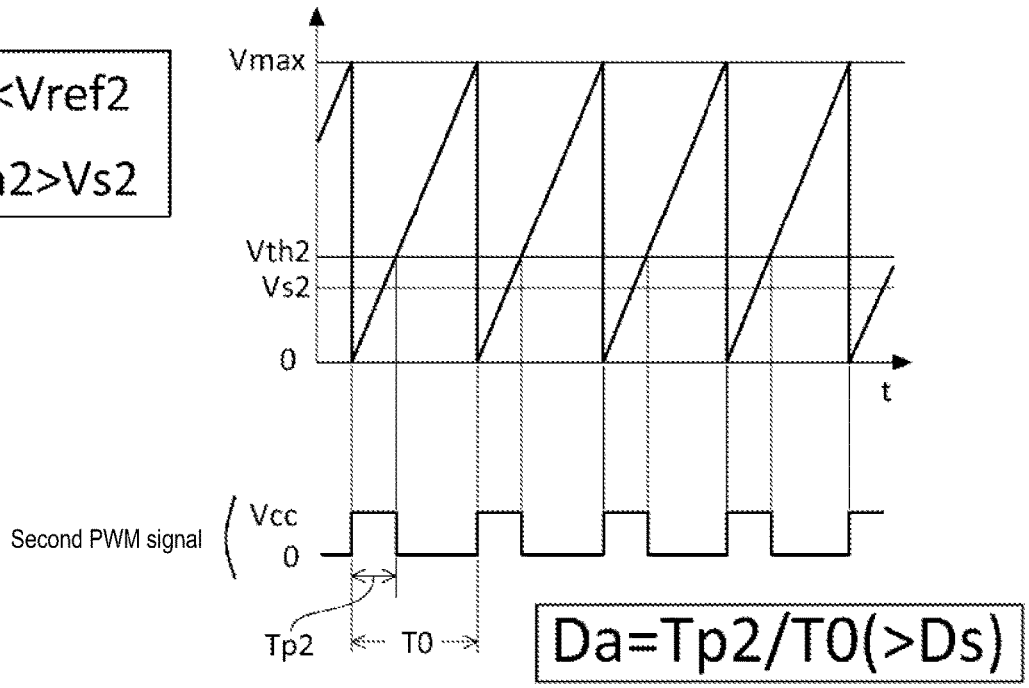
FIG. 3 is a diagram schematically showing examples of states in which a second PWM signal is generated.
Figure 3:
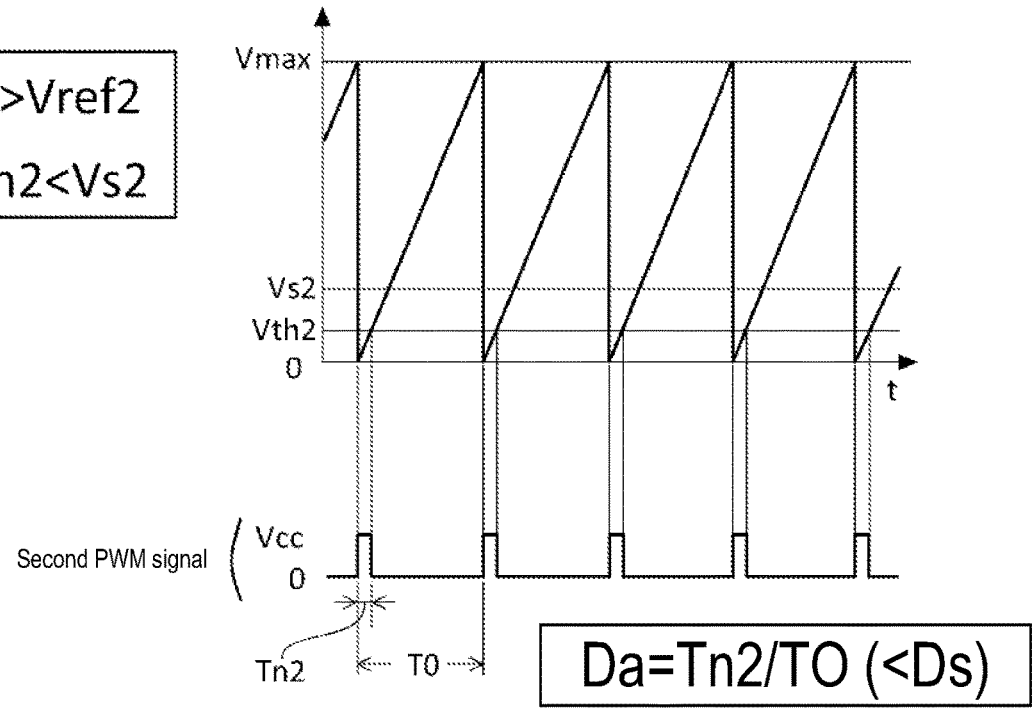

The triangular wave generation unit 90 is configured as a known triangular wave generation circuit and generates a triangular wave (e.g., a saw tooth wave). As shown in FIG. 3, the waveform of the triangular wave generated by the triangular wave generation unit 90 is such that the voltage value is the minimum at the start of each period, the voltage gradually increases during each period, and the voltage falls from the maximum value to the minimum value at the end of each period. The triangular wave is output to the second signal generation circuit 46 (the second PWM generation circuit 42) as well as to a triangular wave inversion circuit 52 (the first PWM generation circuit 40), which will be described later.

The second comparison circuit 44 includes a resistor and a differential amplifier, which are not shown, and is configured to output a voltage Vth2 that is obtained by amplifying the second voltage value. Specifically, the second comparison circuit 44 outputs, to the second signal generation circuit 46, a voltage Vth2 that is amplified to be a second reference voltage Vs2 if the second voltage value is equal to the second target value. Note that the second reference voltage Vs2 is a voltage that is obtained by multiplying the maximum voltage Vmax of the triangular wave by the above-described second target ratio. The second comparison circuit 44 can be configured as, for example, a differential amplifier circuit in which a predetermined voltage is input to a positive side terminal, the second voltage value is input to a negative side terminal, and a difference between the predetermined voltage (a fixed value larger than the second voltage value) and the second voltage value is amplified, and in this case, the larger the second voltage value is, the smaller the output voltage Vth2 is, and the smaller the second voltage value is, the larger the output voltage Vth2 is. If the second voltage value is smaller than the second target value, the voltage Vth2 is larger than the second reference voltage Vs2, and if the second voltage value is larger than the second target value, the voltage Vth2 is smaller than the second reference voltage Vs2.

The second signal generation circuit 46 is a comparator, for example, and generates the second PWM signal through amplification by performing binarization based on a magnitude relation between the voltage Vth2 and the voltage of the triangular wave. More specifically, the second PWM signal is generated such that the second PWM signal becomes a high level (Vcc) if the voltage Vth2 is larger than voltage that is input from the triangular wave generation unit 90 and becomes a low level (0 V) if the voltage Vth2 is smaller than voltage that is input from the triangular wave generation unit 90.

If the voltage Vth2 is equal to the second reference voltage Vs2, a duty ratio Da of the second PWM signal is equal to a reference duty ratio Ds. In the example shown in FIG. 3(A), the voltage Vth2 is larger than the second reference voltage Vs2, and accordingly, the duty ratio Da=Tp2/T0 of the second PWM signal is larger than the reference duty ratio Ds. In the example shown in FIG. 3(B), the voltage Vth2 is smaller than the second reference voltage Vs2, and accordingly, the duty ratio Da=Tn2/T0 of the second PWM signal is smaller than the reference duty ratio Ds.

The first PWM generation circuit 40 generates an inverted PWM signal that is a PWM signal obtained by inverting a signal (a first PWM signal) for updating a duty ratio to make the voltage value of the first conduction path 10 approach a first target value based on the first voltage value and the first target value. The first PWM generation circuit 40 includes a first comparison circuit 48 that compares an analog voltage indicating the first voltage value with the first target value to find a magnitude relation therebetween, a first signal generation circuit 50 that generates the inverted PWM signal based on a result of comparison performed by the first comparison circuit 48 and a triangular wave, and the triangular wave inversion circuit 52 that inverts a triangular wave to be input to the first signal generation circuit 50.

The first comparison circuit 48 includes a resistor and a differential amplifier, which are not shown, and is configured to output a voltage Vth1 that is obtained by amplifying the first voltage value. Specifically, the first comparison circuit 48 outputs, to the first signal generation circuit 50, a voltage Vth1 that is amplified to be a first reference voltage Vs1 if the first voltage value is equal to the first target value. Note that the first reference voltage Vs1 is a voltage that is obtained by multiplying the maximum voltage Vmax of the triangular wave by the first target ratio (%). The first comparison circuit 48 can be configured as, for example, a differential amplifier circuit in which a predetermined voltage is input to a positive side terminal, the first voltage value is input to a negative side terminal, and a difference between the predetermined voltage (a fixed value larger than the first voltage value) and the first voltage value is amplified, and in this case, the larger the first voltage value is, the smaller the output voltage Vth1 is, and the smaller the first voltage value is, the larger the output voltage Vth1 is. If the first voltage value is smaller than the first target value, the voltage Vth1 is larger than the first reference voltage Vs1, and if the first voltage value is larger than the first target value, the voltage Vth1 is smaller than the first reference voltage Vs1.

Figure 4:
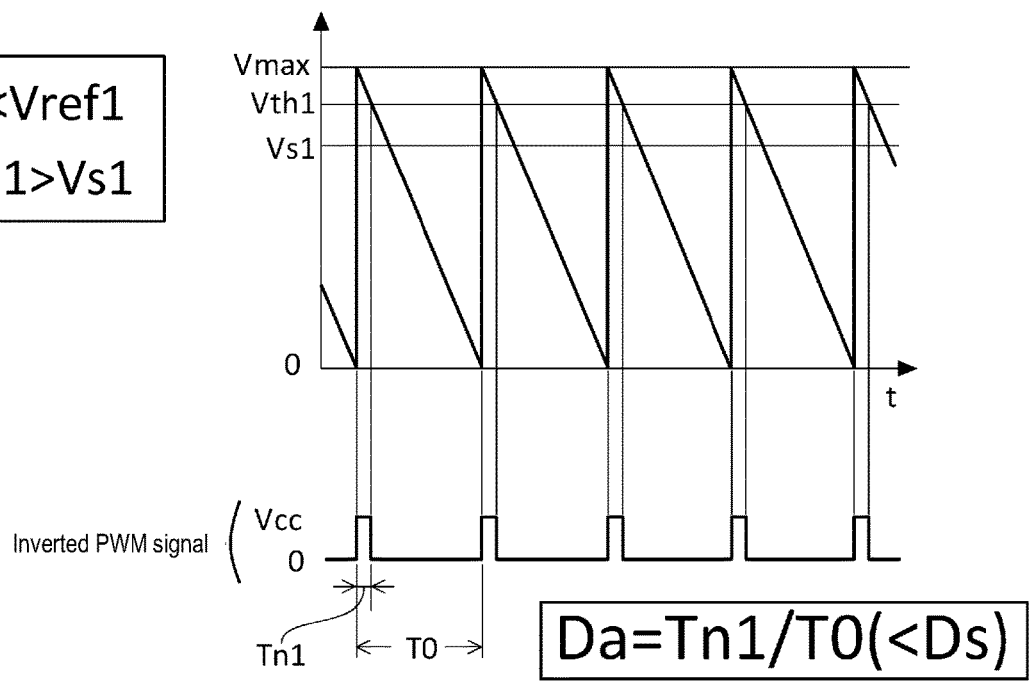
FIG. 4 is a diagram schematically showing examples of states in which an inverted PWM signal is generated.
Figure 4:
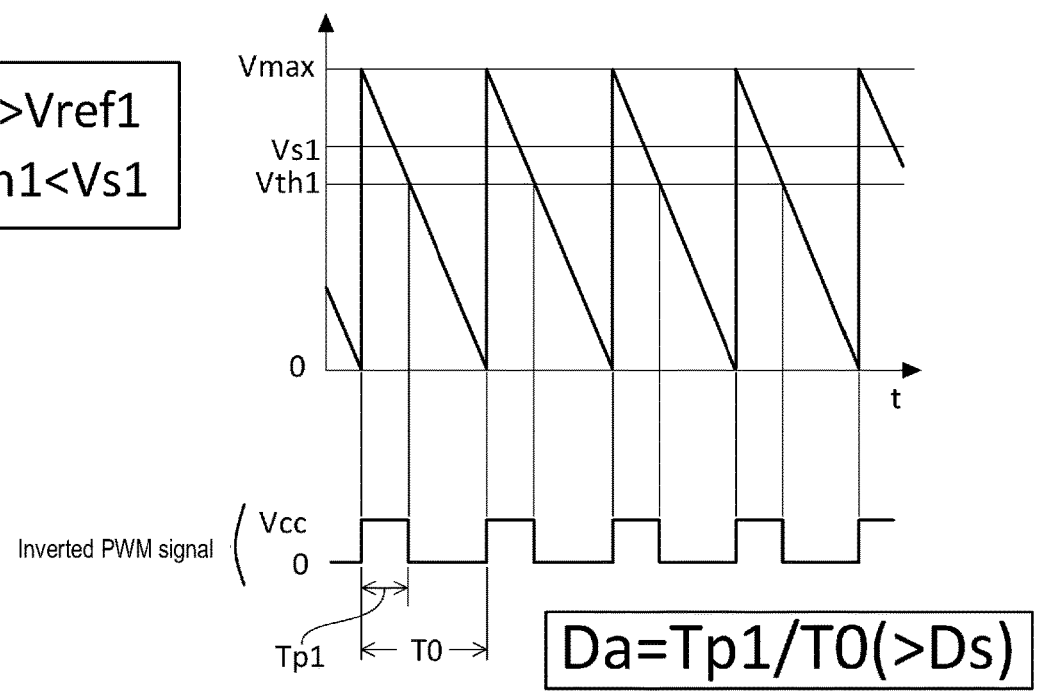

The triangular wave inversion circuit 52 is provided between the triangular wave generation unit 90 and the first signal generation circuit 50, takes a triangular wave output from the triangular wave generation unit 90 as an input, generates an inverted triangular wave by inverting the minimum value and the maximum value, and outputs the inverted triangular wave to the first signal generation circuit 50. As shown in FIG. 4, the waveform of the inverted triangular wave is such that the voltage value is the maximum at the start of each period, the voltage gradually decreases during each period, and the voltage rises from the minimum value to the maximum value at the end of each period.

The first signal generation circuit 50 is a comparator, for example, and generates the inverted PWM signal through amplification by performing binarization based on a magnitude relation between the voltage Vth1 and the voltage of the inverted triangular wave. More specifically, the inverted PWM signal is generated such that the inverted PWM signal becomes a high level (Vcc) if the voltage Vth1 is smaller than the voltage of the inverted triangular wave and becomes a low level (0 V) if the voltage Vth1 is larger than the voltage of the inverted triangular wave.

If the voltage Vth1 is equal to the first reference voltage Vs1, a duty ratio Da of the inverted PWM signal is equal to the reference duty ratio Ds. In the example shown in FIG. 4(A), the voltage Vth1 is larger than the first reference voltage Vs1, and accordingly, the duty ratio Da=Tn1/T0 of the inverted PWM signal is smaller than the reference duty ratio Ds. On the other hand, in the example shown in FIG. 4(B), the voltage Vth1 is smaller than the first reference voltage Vs1, and accordingly, the duty ratio Da=Tp1/T0 of the inverted PWM signal is larger than the reference duty ratio Ds.

As described above, the inverted PWM signal and the second PWM signal are generated using a triangular wave output from the triangular wave generation unit 90, and therefore are synchronized with each other (more specifically, synchronized such that ON start timings are the same). Furthermore, the inverted PWM signal is generated based on a magnitude relation between the voltage Vth1 and the inverted triangular wave obtained by inverting the triangular wave, and therefore a magnitude relation of the duty ratio of the inverted PWM signal relative to the magnitude relation between the first voltage value and the first target value is opposite to a magnitude relation of the duty ratio of the second PWM signal relative to the magnitude relation between the second voltage value and the second target value. Accordingly, the inverted PWM signal and the second PWM signal oppositely act on the voltage conversion unit 20 (cause the step-down operation or the step-up operation) in a case in which the first voltage value is smaller than the first target value and in a case in which the second voltage value is smaller than the second target value.

Note that another configuration may also be adopted to make the magnitude relation of the duty ratio of the inverted PWM signal relative to the magnitude relation between the first voltage value and the first target value opposite to the magnitude relation of the duty ratio of the second PWM signal relative to the magnitude relation between the second voltage value and the second target value. For example, a configuration is also possible in which the inverted PWM signal is generated through comparison with a triangular wave and the second PWM signal is generated through comparison with an inverted triangular wave. Alternatively, it is also possible to invert the magnitude relation of the voltage Vth1 relative to the first reference voltage or invert the magnitude relation of the voltage Vth2 relative to the second reference voltage.

The PWM generation unit 36 includes the AND circuit 54 and the OR circuit 56. Each of the AND circuit 54 and the OR circuit 56 takes the inverted PWM signal output from the first PWM generation circuit 40 as an input and the second PWM signal output from the second PWM generation circuit 42 as an input. The AND circuit 54 outputs an AND signal of a high level if both of the inverted PWM signal and the second PWM signal are at the high level, and outputs an AND signal of a low level if at least one of the inverted PWM signal and the second PWM signal is at the low level. The OR circuit 56 outputs an OR signal of a high level if at least one of the inverted PWM signal and the second PWM signal is at the high level, and outputs an OR signal of a low level if both of the inverted PWM signal and the second PWM signal are at the low level.

Figure 5:
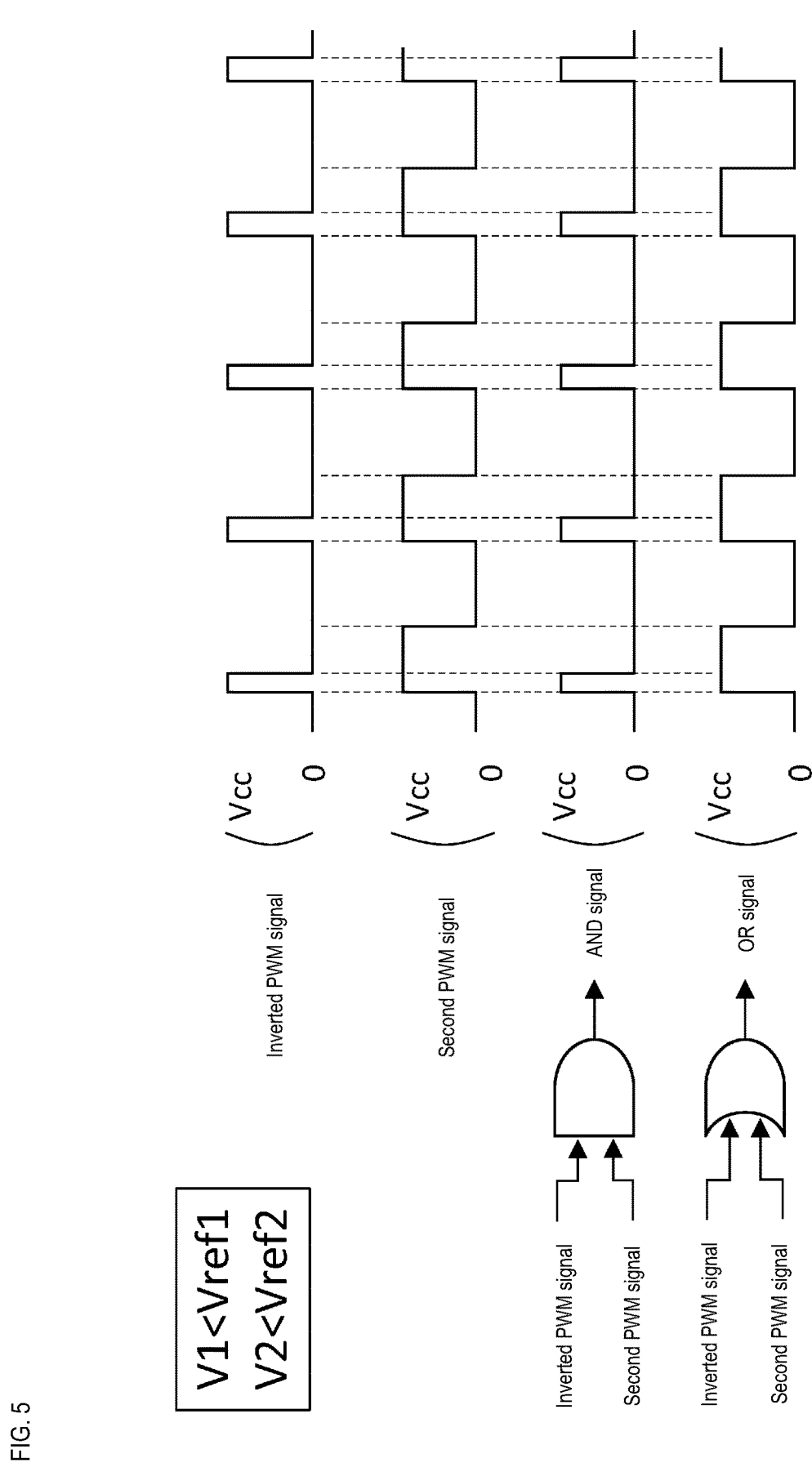
FIG. 5 is a diagram schematically showing an example of a state in which an AND signal and an OR signal are generated.

FIG. 5 shows an example of an AND signal and an OR signal that are output in a case in which the first voltage value is smaller than the first target value and the second voltage value is smaller than the second target value. In this case, the duty ratio Da of the inverted PWM signal is smaller than the reference duty ratio Ds and the duty ratio Da of the second PWM signal is larger than the reference duty ratio Ds. The AND signal is the same as a signal that has a smaller duty ratio Da out of the inverted PWM signal and the second PWM signal, and accordingly, is the same as the inverted PWM signal in this example. On the other hand, the OR signal is the same as a signal that has a larger duty ratio Da out of the inverted PWM signal and the second PWM signal, and accordingly, is the same as the second PWM signal in this example. That is, in a situation in which both of the first voltage value and the second voltage value are smaller than the target values, the AND circuit 54 functions as a circuit that prioritizes the inverted PWM signal and the OR circuit 56 functions as a circuit that prioritizes the second PWM signal. The AND signal generated by the AND circuit 54 and the OR signal generated by the OR circuit 56 are output to the selection unit 58 provided in the PWM generation unit 36.

The selection unit 58 is a multiplexer, for example, and has a function of selecting and outputting either one of the AND signal and the OR signal input from the AND circuit 54 and the OR circuit 56. The selection unit 58 selects the signal that is to be output, following a selection instruction given from a control unit 92 that is provided in the voltage conversion device 1. The selection instruction from the control unit 92 may be given based on an operation performed by a user or the like, or may also be automatically given based on the state of the vehicle. The AND signal or the OR signal output from the selection unit 58 is input to the drive unit 38.

The drive unit 38 has a function of driving the switching elements 22 and 24 (the voltage conversion unit 20) by taking the AND signal or the OR signal output from the selection unit 58 as an input and giving mutually complementary PWM signals that are generated based on the input signal to the switching elements 22 and 24 (the voltage conversion unit 20).

The drive unit 38 includes FET drive circuits 60 and 62 and a PWM inversion circuit 64. The FET drive circuit 60 drives the switching element 22 by applying an ON signal to the gate of the switching element 22 according to an input signal. Specifically, the FET drive circuit 60 drives the switching element 22 by switching the switching element 22 ON when an input PWM signal is at a high level and switching the switching element 22 OFF when the input PWM signal is at a low level.

The FET drive circuit 62 drives the switching element 24 by applying an ON signal to the gate of the switching element 24 according to an input signal. Specifically, the FET drive circuit 62 drives the switching element 24 by switching the switching element 24 ON when an input PWM signal is at a high level and switching the switching element 24 OFF when the input PWM signal is at a low level.

The PWM inversion circuit 64 has a function of inverting the high level and the low level of the AND signal or the OR signal generated by the PWM generation unit 36. The PWM inversion circuit 64 is provided between the FET drive circuit 62 and a connection point between the PWM generation unit 36 and the FET drive circuit 60.

Thus, the switching element 22 is driven at the duty ratio of the AND signal or the OR signal output from the PWM generation unit 36, and the switching element 24 is driven at a duty ratio that is obtained by subtracting the duty ratio of the AND signal or the OR signal output from the PWM generation unit 36 from 1 (in other words, a percentage value obtained by subtracting the percentage value (%) of the duty ratio of the AND signal or the OR signal from 100%).

As described above, the voltage conversion device 1 generates a second PWM signal having a duty ratio Da larger than the reference duty ratio Ds if the second voltage value is smaller than the second target value, and generates a second PWM signal having a duty ratio Da smaller than the reference duty ratio Ds if the second voltage value is larger than the second target value. Also, the voltage conversion device 1 generates an inverted PWM signal having a duty ratio Da smaller than the reference duty ratio Ds if the first voltage value is smaller than the first target value, and generates an inverted PWM signal having a duty ratio Da larger than the reference duty ratio Ds if the first voltage value is larger than the first target value.

Accordingly, in a case in which the selection unit 58 selects the OR signal as an output signal, if the second voltage value is smaller than the second target value and the first voltage value is larger than the first target value, the second PWM signal having a larger duty ratio Da is output as the OR signal. To the contrary, if the second voltage value is larger than the second target value and the first voltage value is smaller than the first target value, the inverted PWM signal having a larger duty ratio Da is output as the OR signal. Furthermore, if both of the second voltage value and the first voltage value are smaller than the target values, the second PWM signal having a larger duty ratio Da is output as the OR signal. That is, if the second voltage value is smaller than the second target value, drive control of the voltage conversion unit 20 can be performed to increase the second voltage value, if the first voltage value is smaller than the first target value, drive control of the voltage conversion unit 20 can be performed to increase the first voltage value, and if both of the second voltage value and the first voltage value are smaller than the target values, drive control of the voltage conversion unit 20 can be performed to increase the second voltage value. Note that in a case in which the selection unit 58 selects the AND signal as an output signal, drive control of the voltage conversion unit 20 can be performed to increase the first voltage value when both of the second voltage value and the first voltage value are smaller than the target values.

Figure 7:
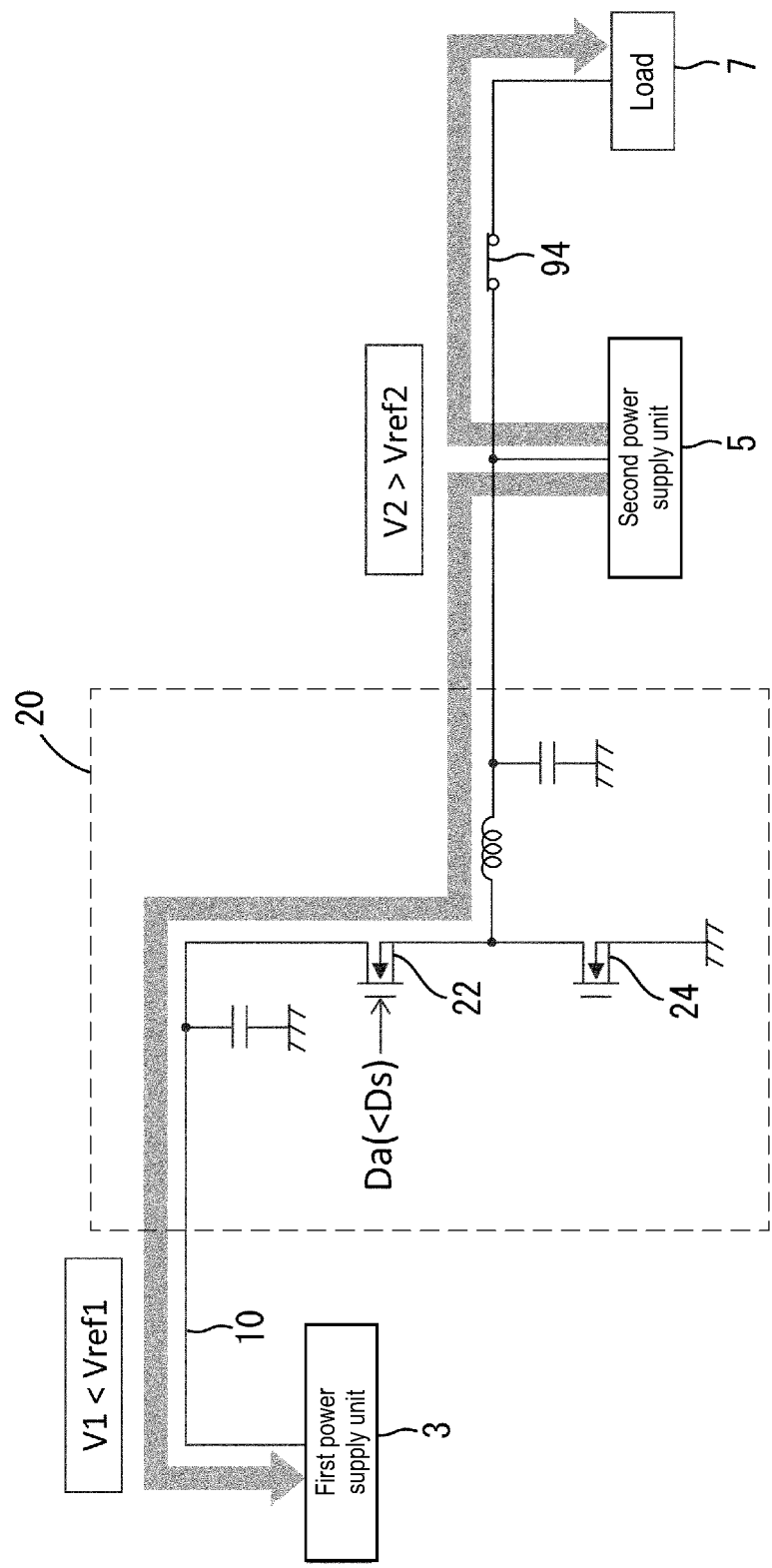
FIG. 7 is a diagram schematically showing an example of a state in which a relay switch is switched ON while the step-up operation is executed.
Figure 8:
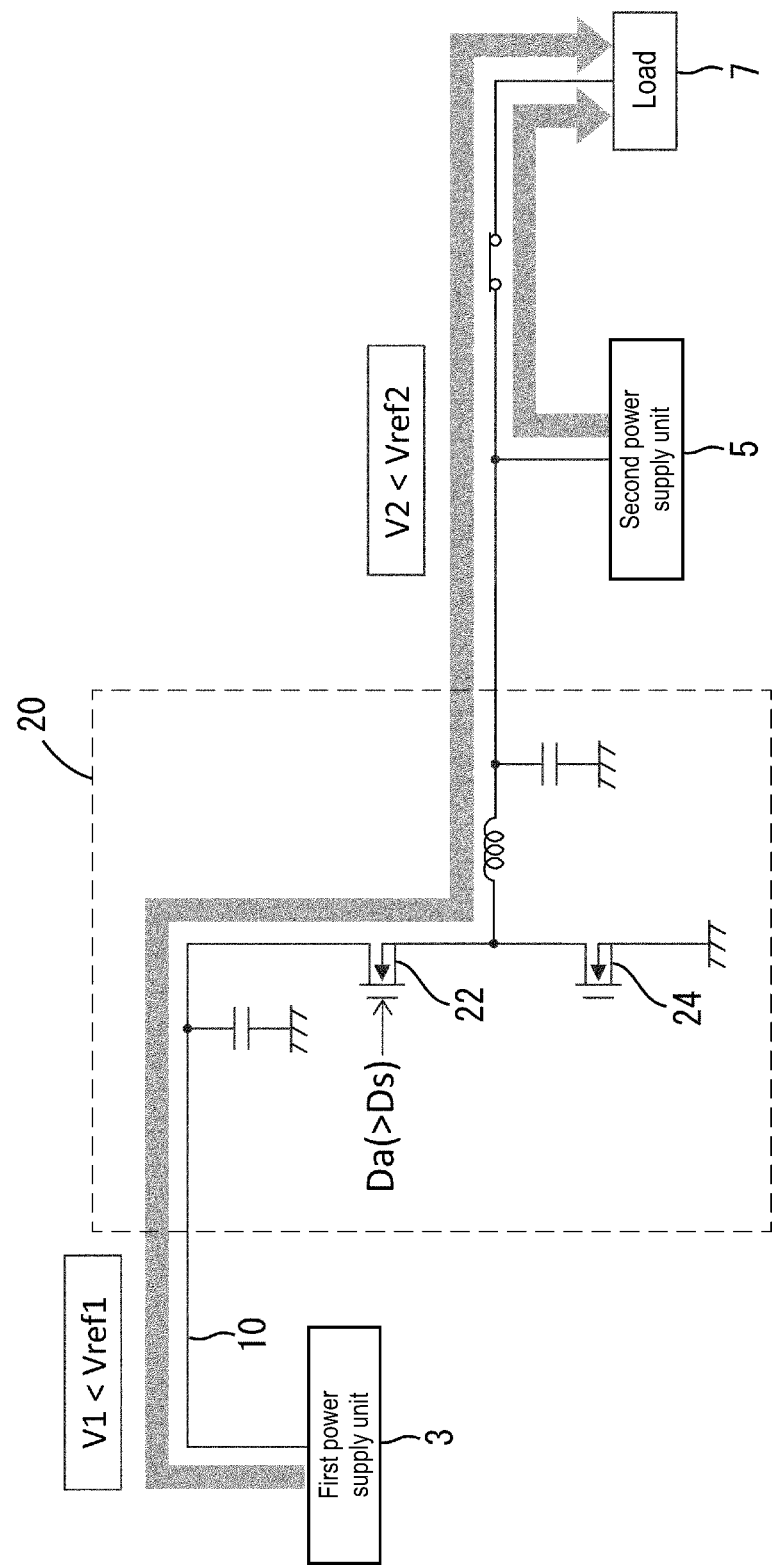
FIG. 8 is a diagram schematically showing an example of a state in which the step-up operation has been switched to a step-down operation.

Next, a specific example of switching between the step-up operation and the step-down operation performed by the voltage conversion device 1 will be described using FIGS. 6 to 8. Here, an example of a case in which switching to the step-down operation is performed while the step-up operation is executed will be described. Assume that the selection unit 58 selects the OR signal as an output signal.

Figure 6:
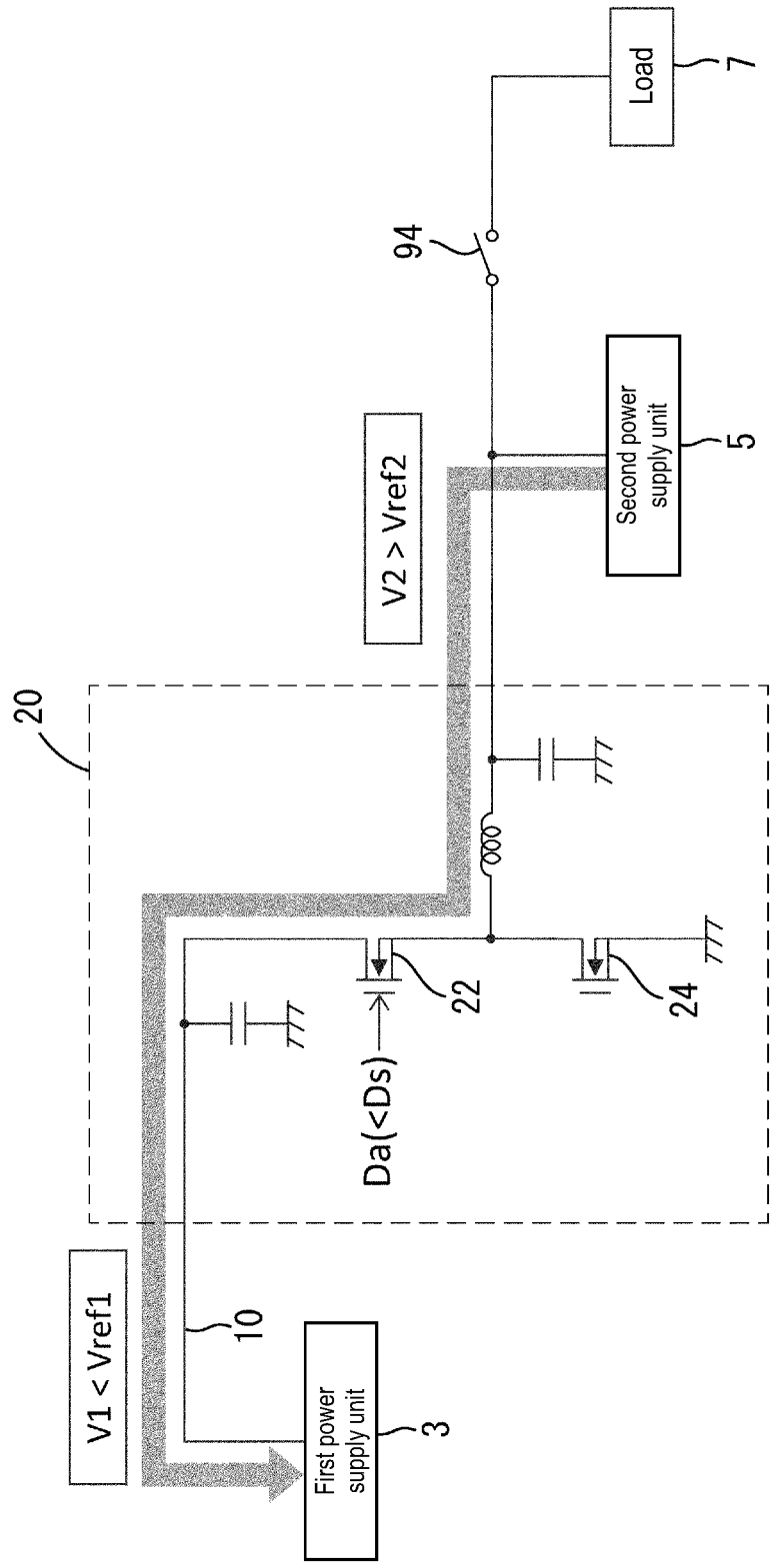
FIG. 6 is a diagram schematically showing an example of a state of a step-up operation.

FIG. 6 shows an operation of the power supply system 100 when the user gets in the vehicle, for example. In the example shown in FIG. 6, the first voltage value is smaller than the first target value, but the second voltage value is larger than the second target value, and therefore the step-up operation is performed to supply power from the second power supply unit 5 to the first power supply unit 3. Thereafter, as shown in FIG. 7, when a relay switch 94 that is provided in correspondence with the load 7 is switched ON in response to a startup operation performed by the user, power is supplied from the second power supply unit 5 to the load 7. That is, the second power supply unit 5 supplies power to both of the first power supply unit 3 and the load 7. As a result, the output voltage of the second power supply unit 5 decreases and the second voltage value becomes smaller than the second target value, and consequently the duty ratio Da of the second PWM signal becomes larger than the reference duty ratio Ds. As a result, the duty ratio Da of the OR signal becomes larger than the reference duty ratio Ds and the step-up operation is switched to the step-down operation as shown in FIG. 8.

As described above, in the voltage conversion device 1, the first signal generation unit 71 generates an inverted PWM signal and a second PWM signal in parallel, the inverted PWM signal being a PWM signal obtained by inverting a first PWM signal that is a signal for updating a duty ratio to make the voltage value of the first conduction path 10 approach a first target value based on the first voltage value and the first target value, the second PWM signal being synchronized with the first PWM signal and being a signal for updating a duty ratio to make the voltage value of the second conduction path 12 approach a second target value based on the second voltage value and the second target value. The inverted PWM signal and the second PWM signal generated by the first signal generation unit 71 are input to the second signal generation unit 72 that can generate at least either of an AND signal and an OR signal as a control signal, the AND signal being an ON signal when both of the inverted PWM signal and the second PWM signal are ON signals and being an OFF signal when at least one of the inverted PWM signal and the second PWM signal is an OFF signal, the OR signal being an ON signal when at least one of the inverted PWM signal and the second PWM signal is an ON signal and being an OFF signal when both of the inverted PWM signal and the second PWM signal are OFF signals. In a configuration in which the AND signal is generated, a signal having a smaller duty ratio out of the inverted PWM signal and the second PWM signal is generated as the AND signal, and in a configuration in which the OR signal is generated, a signal having a larger duty ratio out of the inverted PWM signal and the second PWM signal is generated as the OR signal. With this configuration, it is possible to switch PWM signals without stopping output of a PWM signal, and therefore it is possible to reduce the time it takes to switch the PWM signals, when compared to a configuration in which PWM signals are switched by executing processing for stopping output of a PWM signal that is being output and thereafter starting to output another PWM signal.

Furthermore, the voltage conversion device 1 generates the inverted PWM signal and the second PWM signal such that the magnitude relation of the duty ratio Da of the inverted PWM signal relative to the magnitude relation between the first voltage value and the first target value is opposite to the magnitude relation of the duty ratio Da of the second PWM signal relative to the magnitude relation between the second voltage value and the second target value. Accordingly, the duty ratio Da of the inverted PWM signal in a case in which the first voltage value is smaller than the first target value and the duty ratio Da of the second PWM signal in a case in which the second voltage value is smaller than the second target value are opposite from each other in terms of whether the duty ratios Da increase or decrease. For example, if the duty ratio Da of the inverted PWM signal decreases in a case in which the first voltage value is smaller than the first target value, the duty ratio Da of the second PWM signal increases in a case in which the second voltage value is smaller than the second target value. Therefore, it is possible to cause the voltage conversion unit 20 to perform opposite operations between the case in which the first voltage value is smaller than the first target value and the case in which the second voltage value is smaller than the second target value, and accordingly, it is possible to selectively cause the voltage conversion unit 20 to perform the step-up operation or the step-down operation and prioritize either one of the operations by using the AND signal or the OR signal.

Furthermore, the voltage conversion device 1 generates the inverted PWM signal and the second PWM signal that are synchronized with each other, by using a triangular wave generated by the triangular wave generation unit 90. Thus, the inverted PWM signal and the second PWM signal can be easily synchronized with each other.

Furthermore, in the voltage conversion device 1, the first comparison circuit 48 compares the first voltage value and the first target value. Then, the first signal generation circuit 50 generates the inverted PWM signal based on a result of comparison performed by the first comparison circuit 48 and a triangular wave. Also, the second comparison circuit 44 compares the second voltage value and the second target value. Then, the second signal generation circuit 46 generates the second PWM signal based on a result of comparison performed by the second comparison circuit 44 and a triangular wave. Thus, configurations for generating the inverted PWM signal and the second PWM signal can be kept from becoming complex to further reduce the time it takes to switch the PWM signals.

Furthermore, the voltage conversion device 1 includes the AND circuit 54, the OR circuit 56, and the selection unit 58 that takes the AND signal generated by the AND circuit 54 and the OR signal generated by the OR circuit 56 as inputs and selectively outputs either of the signals. With this configuration, it is possible to select which of the AND signal and the OR signal is to be prioritized.

Embodiment 2

Next, Embodiment 2 will be described.

The above-described voltage conversion device 1 of Embodiment 1 generates a PWM signal without performing AD conversion on the analog voltage indicating the first voltage value and the analog voltage indicating the second voltage value. In contrast, a voltage conversion device 201 of Embodiment 2 generates a PWM signal based on digital values that are obtained by performing AD conversion on the analog voltage indicating the first voltage value and the analog voltage indicating the second voltage value. In the following description and drawings, units that constitute configurations similar to those in the voltage conversion device 1 of Embodiment 1 are denoted with the same reference numerals as those used in the voltage conversion device 1 of Embodiment 1, and detailed descriptions of which are omitted. The voltage conversion device 201 has an overall configuration that is obtained by changing the PWM generation unit 36 of the voltage conversion device 1 shown in FIG. 1 to a PWM generation unit 236.

The voltage conversion device 201 includes the PWM generation unit 236 instead of the PWM generation unit 36 of the voltage conversion device 1. The PWM generation unit 236 includes an AD conversion unit 240 and a control circuit 241. The AD conversion unit 240 is configured as an AD converter, converts input analog voltages to digital values, and outputs the digital values to the control circuit 241. The AD conversion unit 240 takes, as inputs, an analog voltage that is output from the first voltage detection unit 32 and indicates the first voltage value and an analog voltage that is output from the second voltage detection unit 34 and indicates the second voltage value. Note that data regarding the first target value and the second target value is only required to be configured such that the PWM generation unit 236 can hold the data, and the data is given from an external device (not shown) to the PWM generation unit 236, for example.

The control circuit 241 is configured as a MCU (Micro Controller Unit), for example, and includes an arithmetic processing unit constituted by a CPU (Central Processing Unit) or the like and a storage unit constituted by a ROM, a RAM, or the like. The control circuit 241 mainly includes a mediation unit 242 and a PWM output unit 258. The mediation unit 242 includes a first duty ratio generation unit 243, a second duty ratio generation unit 249, an extraction unit 254, a selection instruction unit 256, and so on.

The mediation unit 242 is a unit that selects a larger value or a smaller value out of an inverted duty ratio (%) and a second duty ratio (%), the inverted duty ratio being a value that is obtained by subtracting a first duty ratio (%) from 100%, the first duty ratio (%) being a duty ratio for making the voltage value of the first conduction path 10 approach the first target value based on the first voltage value and the first target value, the second duty ratio (%) being a duty ratio for making the voltage value of the second conduction path 12 approach the second target value based on the second voltage value and the second target value.

The second duty ratio generation unit 249 expresses a result of comparison between the second voltage value and the second target value using a digital value and generates a duty ratio of a PWM signal to be used for drive control of the voltage conversion unit 20 (specifically, the second duty ratio, which is a duty ratio for making the voltage value of the second conduction path 12 approach the second target value based on the second voltage value and the second target value) based on the digital value expressing the result of comparison between the second voltage value and the second target value. The second duty ratio generation unit 249 includes a second difference calculation unit 250 and a second adjustment unit 252.

The second difference calculation unit 250 calculates a second difference (second deviation) between the second voltage value and the second target value. The second adjustment unit 252 has a function of repeatedly performing processing of calculating a duty ratio to make the voltage value of the second conduction path 12 approach the second target value based on the second difference by using a known feedback operation method (e.g., a PI operation method or a PID operation method). More specifically, the second adjustment unit 252 calculates the second duty ratio using a predetermined operation method such that the second duty ratio (%) becomes a predetermined second target ratio (%) if the second voltage value is equal to the second target value, the second duty ratio (%) increases as the second voltage value further falls below the second target value, and the second duty ratio decreases as the second voltage value further rises above the second target value.

The first duty ratio generation unit 243 expresses a result of comparison between the first voltage value and the first target value using a digital value and generates a duty ratio of a PWM signal to be used for drive control of the voltage conversion unit 20 (specifically, the first duty ratio, which is a duty ratio for making the voltage value of the first conduction path 10 approach the first target value based on the first voltage value and the first target value) based on the digital value expressing the result of comparison between the first voltage value and the first target value. The first duty ratio generation unit 243 includes a first difference calculation unit 244 and a first adjustment unit 246.

The first difference calculation unit 244 calculates a first difference (first deviation) between the first voltage value and the first target value. The first adjustment unit 246 has a function of repeatedly performing processing of calculating a duty ratio to make the voltage value of the first conduction path 10 approach the first target value based on the first difference by using a known feedback operation method (e.g., a PI operation method or a PID operation method). More specifically, the first adjustment unit 246 calculates the first duty ratio using a predetermined operation method such that the first duty ratio becomes a predetermined first target ratio (%) if the first voltage value is equal to the first target value, the first duty ratio increases as the first voltage value further falls below the first target value, and the first duty ratio decreases as the first voltage value further rises above the first target value. The first target ratio (%) is a value obtained by subtracting the second target ratio (%) from 100%. An inversion unit 248 generates an inverted duty ratio (%) that is a value obtained by subtracting the first duty ratio from 100%.

The extraction unit 254 extracts a smaller value of a larger value out of the inverted duty ratio and the second duty ratio. Which of the smaller value and the larger value is to be extracted (selected) is set according to an instruction given from the selection instruction unit 256, and the extraction unit 254 selects either one of the duty ratios following the setting. The extraction unit 254 outputs the selected duty ratio to the PWM output unit 258. The PWM output unit 258 generates a PWM signal that has the duty ratio selected by the extraction unit 254 and outputs the PWM signal to the drive unit 38. The drive unit 38 inputs the PWM signal (i.e., the PWM signal output from the PWM output unit 258) according to the duty ratio selected by the mediation unit 242 as a control signal to the first switching element 22 and inputs an inverted signal that is obtained by inverting the control signal to the second switching element 24.

As described above, in the voltage conversion device 201, the mediation unit 242 selects a larger value or a smaller value out of the inverted duty ratio and the second duty ratio, the inverted duty ratio being a value obtained by subtracting the first duty ratio from 100%, the first duty ratio being a duty ratio for making the voltage value of the first conduction path 10 approach the first target value based on the first voltage value and the first target value, the second duty ratio being a duty ratio for making the voltage value of the second conduction path 12 approach the second target value based on the second voltage value and the second target value. Then, the drive unit 38 inputs a PWM signal according to the duty ratio selected by the mediation unit 242 as a control signal to the first switching element 22 and inputs an inverted signal obtained by inverting the control signal to the second switching element 24. Specifically, the voltage conversion device 201 expresses a result of comparison between the first voltage value and the first target value using a digital value and generates a duty ratio (the first duty ratio) of a PWM signal to be used for drive control of the voltage conversion unit 20 based on the digital value expressing the result of comparison between the first voltage value and the first target value. Also, the voltage conversion device 201 expresses a result of comparison between the second voltage value and the second target value using a digital value and generates a duty ratio (the second duty ratio) of a PWM signal to be used for drive control of the voltage conversion unit 20 based on the digital value expressing the result of comparison between the second voltage value and the second target value. Then, the voltage conversion device 201 can extract a smaller value or a larger value out of an inverted duty ratio, which is a value obtained by subtracting the first duty ratio from 100%, and the second duty ratio, and generate a PWM signal having the extracted duty ratio. With this configuration, it is possible to switch PWM signals without stopping output of the PWM signal, and therefore it is possible to reduce the time it takes to switch the PWM signals, when compared to a configuration in which PWM signals are switched by executing processing for stopping output of a PWM signal that is being output and thereafter starting to output another PWM signal.

Furthermore, the voltage conversion device 201 increases the first duty ratio as the first voltage value further falls below the first target value, and reduces the first duty ratio as the first voltage value further rises above the first target value. That is, the voltage conversion device 201 reduces the inverted duty ratio as the first voltage value further falls below the first target value, and increases the inverted duty ratio as the first voltage value further rises above the first target value. On the other hand, the voltage conversion device 201 increases the second duty ratio as the second voltage value further falls below the second target value, and reduces the second duty ratio as the second voltage value further rises above the second target value. Therefore, the inverted duty ratio in a case in which the first voltage value is smaller than the first target value and the second duty ratio in a case in which the second voltage value is smaller than the second target value are opposite from each other in terms of whether the duty ratios increase or decrease. With this configuration, it is possible to cause the voltage conversion unit 20 to perform opposite operations between the case in which the first voltage value is smaller than the first target value and the case in which the second voltage value is smaller than the second target value, and therefore the step-up operation and the step-down operation can be switched when a magnitude relation between the inverted duty ratio and the second duty ratio has changed to the opposite.

Furthermore, the voltage conversion device 201 includes the AD conversion unit 240 that converts an analog voltage indicating the first voltage value to a digital value and converts an analog voltage indicating the second voltage value to a digital value. The first duty ratio generation unit 243 includes the first difference calculation unit 244 that calculates the first difference (first deviation) between the first voltage value indicated by the digital value and the first target value and the first adjustment unit 246 that generates the first duty ratio. The first adjustment unit 246 calculates the first duty ratio using a predetermined operation method such that the first duty ratio becomes the predetermined first target ratio (%) if the first voltage value is equal to the first target value, the first duty ratio increases as the first voltage value further falls below the first target value, and the first duty ratio decreases as the first voltage value further rises above the first target value. The second duty ratio generation unit 249 includes the second difference calculation unit 250 that calculates the second difference between the second voltage value indicated by the digital value and the second target value and the second adjustment unit 252 that generates the second duty ratio. The second adjustment unit 252 calculates the second duty ratio using a predetermined operation method such that the second duty ratio becomes the predetermined second target ratio (%) if the second voltage value is equal to the second target value, the second duty ratio increases as the second voltage value further falls below the second target value, and the second duty ratio decreases as the second voltage value further rises above the second target value. The second target ratio (%) is a value obtained by subtracting the first target ratio (%) from 100%. Furthermore, the first duty ratio generation unit 243 includes the inversion unit 248 that generates the inverted duty ratio that is a value obtained by subtracting the first duty ratio from 100%. Thus, the configuration for generating a PWM signal can be kept from becoming complex to further reduce the time it takes to switch the PWM signals.

Furthermore, in the voltage conversion device 201, according to a selection instruction given from the selection instruction unit 256, the extraction unit 254 is switched between a state in which the extraction unit 254 extracts a smaller value and a state in which the extraction unit 254 extracts a larger value by comparing the inverted duty ratio and the second duty ratio. Therefore, it is possible to select which of a PWM signal having the inverted duty ratio and a PWM signal having the second duty ratio is to be preferentially generated.

Embodiment 3

Next, Embodiment 3 will be described with reference to FIG. 10. Embodiment 3 differs from Embodiment 1 only in the positions of the triangular wave inversion circuit 52 and the PWM inversion circuit 64 and is the same as Embodiment 1 in other aspects. The voltage conversion device 1 in Embodiment 3 has the same overall configuration as the voltage conversion device 1 shown in FIG. 1, and only internal configurations of the PWM generation unit 36 and the drive unit 38 slightly differ from those in Embodiment 1. In the configuration shown in FIG. 10, units that are similar to those in the configuration shown in FIG. 2 are denoted with the same reference numerals as those used in the configuration shown in FIG. 2, and detailed descriptions of which are omitted.

Figure 10:
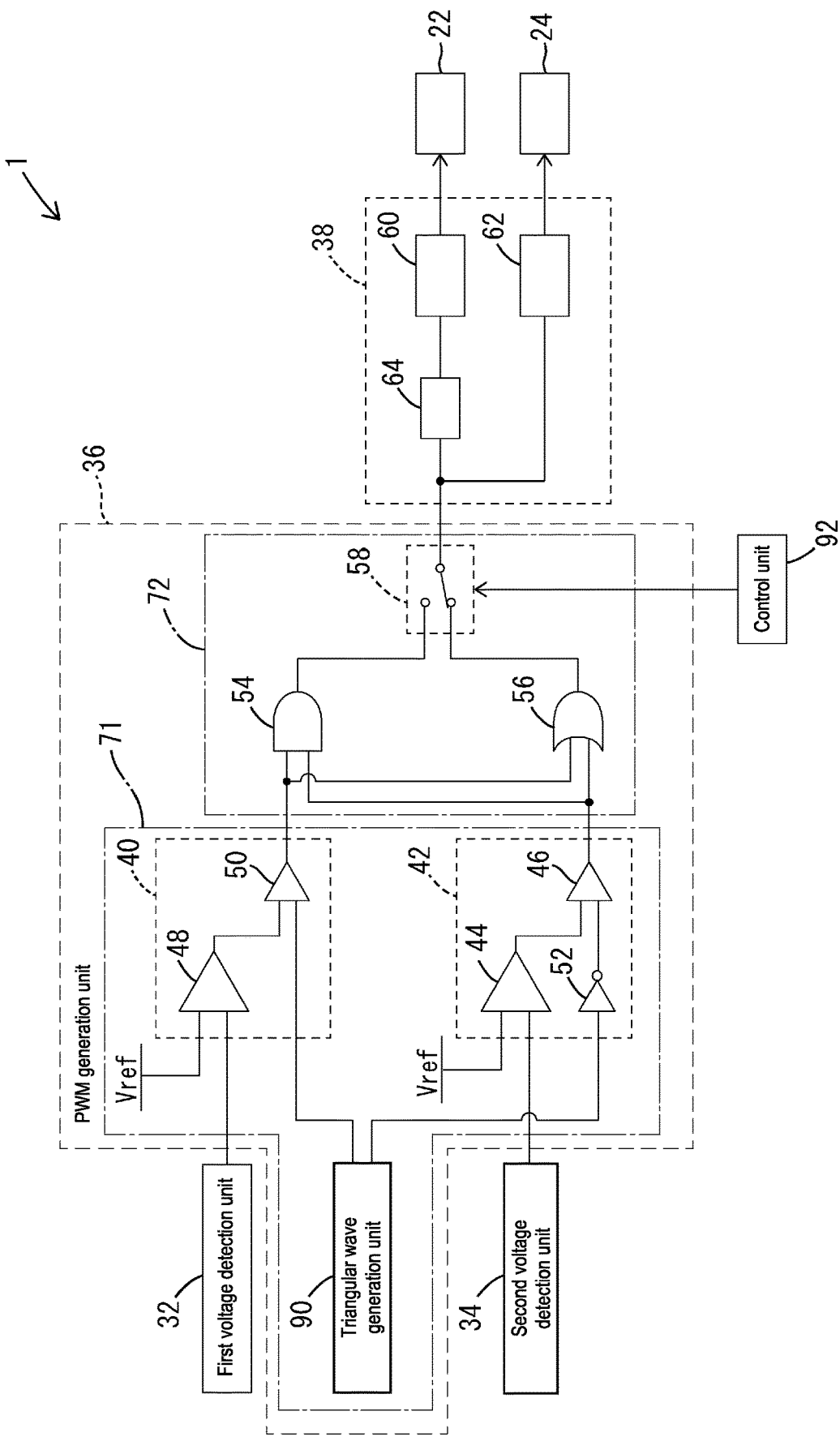
FIG. 10 is a block diagram showing a specific example of a configuration of a voltage conversion device according to Embodiment 3.

In the configuration of Embodiment 3 shown in FIG. 10, the first PWM generation circuit 40 in the first signal generation unit 71 generates a first PWM signal that is a signal for updating a duty ratio to make the voltage value of the first conduction path 10 approach the first target value based on the first voltage value detected by the first voltage detection unit 32 and the first target value. The second PWM generation circuit 42 generates an inverted PWM signal that is a PWM signal obtained by inverting a second PWM signal (a signal that is synchronized with the first PWM signal and is a signal for updating a duty ratio to make the voltage value of the second conduction path 12 approach the second target value based on the second voltage value detected by the second voltage detection unit 34 and the second target value). Thus, the first signal generation unit 71 generates the inverted PWM signal and the first PWM signal in parallel.

The inverted PWM signal and the first PWM signal generated by the first signal generation unit 71 are input to the second signal generation unit 72 in which the AND circuit 54 can generate an AND signal (a signal that is an ON signal when both of the inverted PWM signal and the first PWM signal are ON signals and that is an OFF signal when at least one of the inverted PWM signal and the first PWM signal is an OFF signal). Furthermore, the OR circuit 56 can generate an OR signal (a signal that is an ON signal when at least one of the inverted PWM signal and the first PWM signal is an ON signal and that is an OFF signal when both of the inverted PWM signal and the first PWM signal are OFF signals). The selection unit 58 operates similarly to the selection unit 58 in Embodiment 1.

The drive unit 38 inputs a control signal generated by the second signal generation unit 72 to the switching element 24 and inputs an inverted signal obtained by inverting the control signal to the switching element 22.

Embodiment 4

Figure 9:
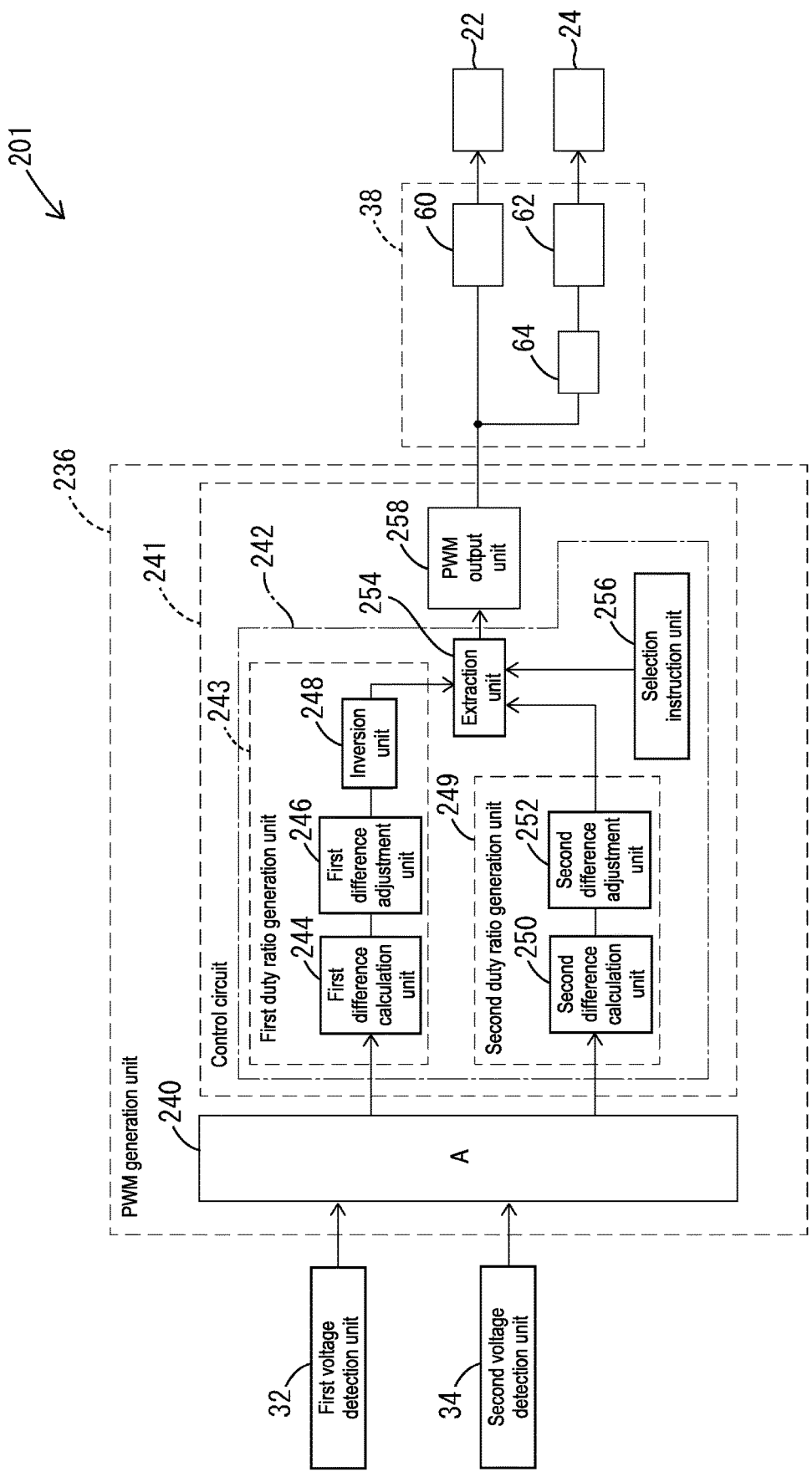
FIG. 9 is a block diagram showing a specific example of a configuration of a voltage conversion device according to Embodiment 2.

Next, Embodiment 4 will be described with reference to FIG. 11. Embodiment 4 differs from Embodiment 2 only in the positions of the inversion unit 248 and the PWM inversion circuit 64 and is the same as Embodiment 2 in other aspects. The overall configuration of the voltage conversion device 201 in Embodiment 4 is similar to that in Embodiment 2 and is obtained by changing the PWM generation unit 36 in the voltage conversion device 1 shown in FIG. 1 to the PWM generation unit 236 and changing the drive unit 38 shown in FIG. 1 to the drive unit 38 shown in FIG. 11. In the configuration shown in FIG. 11, units that are similar to those in the configuration shown in FIG. 9 are denoted with the same reference numerals as those used in the configuration shown in FIG. 9, and detailed descriptions of which are omitted.

Figure 11:
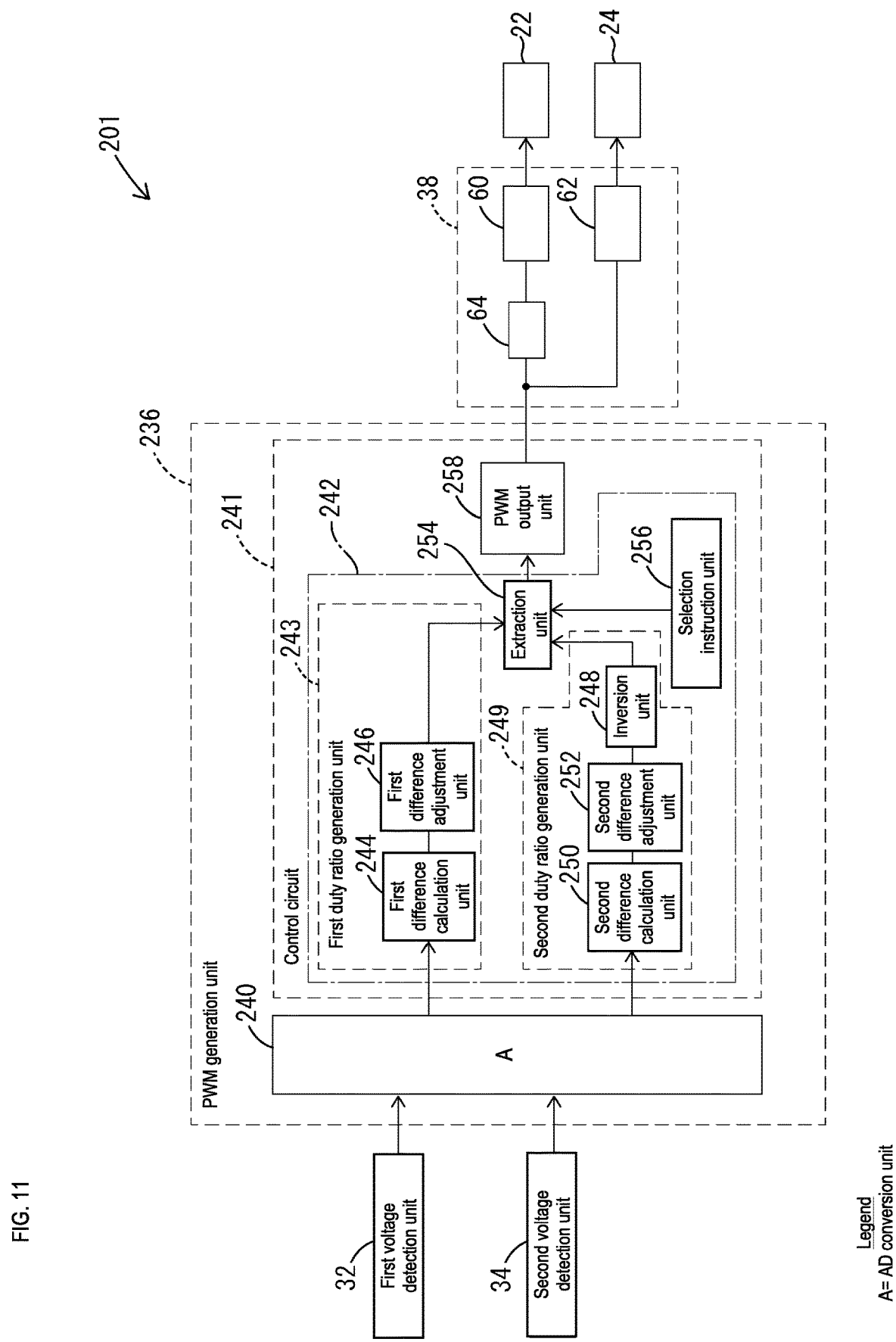
FIG. 11 is a block diagram showing a specific example of a configuration of a voltage conversion device according to Embodiment 4.

In the configuration of Embodiment 4 shown in FIG. 11, the first duty ratio generation unit 243 in the mediation unit 242 calculates a first duty ratio that is a duty ratio for making the voltage value of the first conduction path 10 approach the first target value based on the first voltage value detected by the first voltage detection unit 32 and the first target value. The second duty ratio generation unit 249 calculates an inverted duty ratio that is a value obtained by subtracting a second duty ratio (a duty ratio for making the voltage value of the second conduction path 12 approach the second target value) from 100% based on the second voltage value detected by the second voltage detection unit 34 and the second target value. Then, a larger value or a smaller value is selected out of the first duty ratio and the inverted duty ratio. The extraction unit 254, the selection instruction unit 256, and the PWM output unit 258 operate similarly to Embodiment 2.

Then, the drive unit 38 inputs a PWM signal according to a duty ratio selected by the mediation unit 242 as a control signal to the switching element 24 and inputs an inverted signal obtained by inverting the control signal to the switching element 22.

Other Embodiments

The present disclosure is not limited to the embodiments described with reference to the drawings, and for example, the following embodiments are also included in the technical scope of the present disclosure.

In Embodiments 2 and 4, a result of comparison between the first voltage value that has been subjected to AD conversion and the first target value is expressed using a digital value as a configuration for "expressing a result of comparison between the first voltage value and the first target value using a digital value". However, a configuration is also possible in which a result of comparison between the first voltage value and the first target value is expressed using a digital value by converting a result of comparison between an analog voltage indicating the first voltage value and an analog voltage indicating the first target value to a digital value. Likewise, as a configuration for "expressing a result of comparison between the second voltage value and the second target value using a digital value", a configuration is also possible in which a result of comparison between the second voltage value and the second target value is expressed using a digital value by converting a result of comparison between an analog voltage indicating the second voltage value and an analog voltage indicating the second target value to a digital value.

The invention claimed is:

1. A voltage conversion device comprising:
   a voltage conversion unit that includes a first switching element on a high side and a second switching element on a low side and is configured to perform a step-down operation of stepping down an input voltage applied to a first conduction path and outputting the stepped-down voltage to a second conduction path through an ON/OFF operation of the first switching element and a step-up operation of stepping up an input voltage applied to the second conduction path and outputting the stepped-up voltage to the first conduction path through an ON/OFF operation of the second switching element;

a first voltage detection unit configured to detect a first voltage value that is a voltage value of the first conduction path;
a second voltage detection unit configured to detect a second voltage value that is a voltage value of the second conduction path;
a first signal generation unit configured to generate an inverted PWM signal and a second PWM signal in parallel, the inverted PWM signal being a PWM signal obtained by inverting a first PWM signal that is a signal for updating a duty ratio to make the voltage value of the first conduction path approach a first target value based on the first voltage value and the first target value, the second PWM signal being synchronized with the first PWM signal and being a signal for updating a duty ratio to make the voltage value of the second conduction path approach a second target value based on the second voltage value and the second target value;
a second signal generation unit to which the inverted PWM signal and the second PWM signal generated by the first signal generation unit are input and that is configured to generate at least either of an AND signal and an OR signal as a control signal, the AND signal being an ON signal when both of the inverted PWM signal and the second PWM signal are ON signals and being an OFF signal when at least one of the inverted PWM signal and the second PWM signal is an OFF signal, the OR signal being an ON signal when at least one of the inverted PWM signal and the second PWM signal is an ON signal and being an OFF signal when both of the inverted PWM signal and the second PWM signal are OFF signals; and
a drive unit configured to input the control signal generated by the second signal generation unit to the first switching element and input an inverted signal that is obtained by inverting the control signal to the second switching element,
wherein the second signal generation unit includes:
an AND circuit that generates the AND signal;
an OR circuit that generates the OR signal; and
a selection unit that selects either of a signal output from the AND circuit and a signal output from the OR circuit as the control signal.

2. A voltage conversion device comprising:
a voltage conversion unit that includes a first switching element on a high side and a second switching element on a low side and is configured to perform a step-down operation of stepping down an input voltage applied to a first conduction path and outputting the stepped-down voltage to a second conduction path through an ON/OFF operation of the first switching element and a step-up operation of stepping up an input voltage applied to the second conduction path and outputting the stepped-up voltage to the first conduction path through an ON/OFF operation of the second switching element;
a first voltage detection unit configured to detect a first voltage value that is a voltage value of the first conduction path;
a second voltage detection unit configured to detect a second voltage value that is a voltage value of the second conduction path;
a first signal generation unit configured to generate an inverted PWM signal and a first PWM signal in parallel, the first PWM signal being a signal for updating a duty ratio to make the voltage value of the first conduction path approach a first target value based on the first voltage value and the first target value, the inverted PWM signal being a PWM signal obtained by inverting a second PWM signal that is synchronized with the first PWM signal and is a signal for updating a duty ratio to make the voltage value of the second conduction path approach a second target value based on the second voltage value and the second target value;
a second signal generation unit to which the inverted PWM signal and the first PWM signal generated by the first signal generation unit are input and that is configured to generate at least either of an AND signal and an OR signal as a control signal, the AND signal being an ON signal when both of the inverted PWM signal and the first PWM signal are ON signals and being an OFF signal when at least one of the inverted PWM signal and the first PWM signal is an OFF signal, the OR signal being an ON signal when at least one of the inverted PWM signal and the first PWM signal is an ON signal and being an OFF signal when both of the inverted PWM signal and the first PWM signal are OFF signals; and
a drive unit configured to input the control signal generated by the second signal generation unit to the second switching element and input an inverted signal that is obtained by inverting the control signal to the first switching element,
wherein the second signal generation unit includes:
an AND circuit that generates the AND signal;
an OR circuit that generates the OR signal; and
a selection unit that selects either of a signal output from the AND circuit and a signal output from the OR circuit as the control signal.

3. A voltage conversion device comprising:
a voltage conversion unit that includes a first switching element on a high side and a second switching element on a low side and is configured to perform a step-down operation of stepping down an input voltage applied to a first conduction path and outputting the stepped-down voltage to a second conduction path through an ON/OFF operation of the first switching element and a step-up operation of stepping up an input voltage applied to the second conduction path and outputting the stepped-up voltage to the first conduction path through an ON/OFF operation of the second switching element;
a first voltage detection unit configured to detect a first voltage value that is a voltage value of the first conduction path;
a second voltage detection unit configured to detect a second voltage value that is a voltage value of the second conduction path;
a mediation unit configured to select a larger value or a smaller value out of an inverted duty ratio and a second duty ratio, the inverted duty ratio being a value obtained by subtracting a first duty ratio from 100%, the first duty ratio being a duty ratio for making the voltage value of the first conduction path approach a first target value based on the first voltage value and the first target value, the second duty ratio being a duty ratio for making the voltage value of the second conduction path approach a second target value based on the second voltage value and the second target value; and
a drive unit configured to input a PWM signal according to a duty ratio selected by the mediation unit as a control signal to the first switching element and input an inverted signal that is obtained by inverting the control signal to the second switching element, wherein the mediation unit includes a switching unit that switches which of the larger value and the smaller value is to be extracted.

4. A voltage conversion device comprising:

a voltage conversion unit that includes a first switching element on a high side and a second switching element on a low side and is configured to perform a step-down operation of stepping down an input voltage applied to a first conduction path and outputting the stepped-down voltage to a second conduction path through an ON/OFF operation of the first switching element and a step-up operation of stepping up an input voltage applied to the second conduction path and outputting the stepped-up voltage to the first conduction path through an ON/OFF operation of the second switching element;

a first voltage detection unit configured to detect a first voltage value that is a voltage value of the first conduction path;

a second voltage detection unit configured to detect a second voltage value that is a voltage value of the second conduction path;

a mediation unit configured to select a larger value or a smaller value out of an inverted duty ratio and a first duty ratio, the inverted duty ratio being a value obtained by subtracting a second duty ratio from 100%, the first duty ratio being a duty ratio for making the voltage value of the first conduction path approach a first target value based on the first voltage value and the first target value, the second duty ratio being a duty ratio for making the voltage value of the second conduction path approach a second target value based on the second voltage value and the second target value; and a drive unit configured to input a PWM signal according to a duty ratio selected by the mediation unit as a control signal to the second switching element and input an inverted signal that is obtained by inverting the control signal to the first switching element, wherein the mediation unit includes a switching unit that switches which of the larger value and the smaller value is to be extracted.

\* \* \* \* \*